(12) United States Patent
Goswami et al.

(10) Patent No.: US 9,202,005 B2
(45) Date of Patent: Dec. 1, 2015

(54) DEVELOPMENT AND DEBUG ENVIRONMENT IN A CONSTRAINED RANDOM VERIFICATION

(71) Applicant: Synopsys, Inc., Mountain View, CA (US)

(72) Inventors: Dhiraj Goswami, Wilsonville, OR (US); Aijun Hu, Cupertino, CA (US); Na Xing, San Jose, CA (US); Jason Chung-Shih Chen, Ottawa (CA); Ngai Ngai William Hung, San Jose, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/472,058

(22) Filed: Aug. 28, 2014

(65) Prior Publication Data

US 2015/0067622 A1    Mar. 5, 2015

Related U.S. Application Data

(60) Provisional application No. 61/870,965, filed on Aug. 28, 2013.

(51) Int. Cl.
*G06F 17/50* (2006.01)

(52) U.S. Cl.
CPC ........ *G06F 17/5081* (2013.01); *G06F 17/5009* (2013.01)

(58) Field of Classification Search
CPC .............. G06F 17/505; G06F 17/5054; G06F 17/5045; G06F 17/5081; G06F 13/10; G06F 15/177; G06F 15/7871; G06F 17/5022; G06F 17/5027; G06F 17/5077; G06F 19/00; G06F 11/263; G06F 17/5009; G06F 2217/01
USPC ........................................ 716/100–108, 111
See application file for complete search history.

(56) References Cited

U.S. PATENT DOCUMENTS 7,870,523 B1 *  1/2011  Uziel et al. .................... 716/106
8,370,273 B2     2/2013  Hung et al.
8,904,321 B1 * 12/2014  Cohen et al. .................. 716/107

* cited by examiner

*Primary Examiner* — Binh Tat
(74) *Attorney, Agent, or Firm* — Fenwick & West LLP

(57) ABSTRACT

A design verification workstation contains both debug and constraint solver capabilities during simulation of a design under test. The design verification workstation is configured to allow the user to debug constraints, stop the constraint solver, navigate problems and variables, and make modifications on-the fly during the simulation to constraint information. Additionally, in some embodiments, the design verification workstation may allow a user to use a constraint solver to experiment if the modifications will lead to desired test stimulus. Since this debug process happens during simulation, users do not need to recompile the test case. Additionally, once a user is satisfied with the modifications made to the simulation, the modification could be saved for future usage.

19 Claims, 4 Drawing Sheets

DEVELOPMENT AND DEBUG ENVIRONMENT IN A CONSTRAINED RANDOM VERIFICATION

BACKGROUND

1. Field of Disclosure

This disclosure relates to functional verification of system of chip designs generally, and specifically to improved functional verification of system on chip designs using constrained random verification from both debug and development perspectives.

2. Description of the Related Art

Constrained random verification has been widely adopted for functional verification of complex chip designs. In a typical constrained random simulation methodology, a TestBench will generate random stimulus as inputs to drive the simulation. The random stimuli cannot be arbitrarily random values; rather, they must encapsulate the environment surrounding the design-under-test (DUT). Hence, the user typically writes a set of constraints (e.g., using SystemVerilog) to restrict the random stimulus. During simulation, a constraint solver (e.g., in a Verilog Compiled Simulator) will find a random solution that satisfies the user specified constraints, and the TestBench will use the constraint solver result to drive the simulation. In order for the simulation to make forward progress, the constraint solver is called repeatedly to generate random stimuli. As the design projects and verification tasks grow exponentially, the complexity of their constraints also explodes drastically.

In cases where the constraints are not written or organized properly, users can run into different problems. For example, randomization may fail due to inconsistencies in the constraints, errors (e.g., out of bound indexing), timeouts may occur (e.g., while processing difficult constraints), etc. These are problems indicated by the constraint solver in the simulator which could cause the simulation to terminate prematurely. The simulator may provide a clear point of failure for the TestBench developer to debug. There are other types of problems that require more effort to identify the true point of failure. For example, while a randomization is successful (i.e., a solution is found to satisfy the constraints) the generated test stimulus values may not correspond with expected values due to an incorrect or incomplete specification of constraints. The unexpected values propagate to the rest of the system and eventually cause other error symptoms to show up deeper in the design. To back track the error symptom to the problematic randomization may take additional debug effort. Another problem may be related to the solution distribution of the constrained random values. Not all solutions of the randomization share the same level of functional significance to the design verification problem. If some of the functional significant solution values are generated with less probability, it could mean additional randomizations of stimuli using a larger number of tests and/or making some tests run longer.

Debug activities for constraints are typically carried out on the text information printed by the simulator. Users would have to analyze the information manually, modify the code, re-compile, and rerun simulation to verify a tentative solution to the problem. There are a number of inefficiencies in this methodology. Processing the text information, which may be lengthy for a complex randomization problem, can be time consuming. Also, compilation time for a large system on chip (SoC) design can be long, and having to repeatedly debug, recompile, and re-execute the simulation can be a time consuming process. Additionally, this manual process would occur in an iterative process, until the user correct the problem in the constraints—which may be very time intensive. Moreover, with the increased use of standardized verification methodologies as well as verification intellectual property (IP) coming from different design teams and commercial vendors, the users debugging constraints do not necessarily know where the randomize calls are in the TestBench code and/or what constraints may have already existed within the verification IP that the user is building and debugging on top of.

Most of the debug activities are reactive to address some failure symptoms in functional verification of the design. This implies that unless there are specific observers or checkers for these symptoms in the verification environment, many of the solution space and distribution space related constraint problem on the stimulus are undetected, risking real design failures in the real systems. Due to these dependencies, many of the solution and distribution space related constraint problems are generally detected later in the TestBench development cycle.

SUMMARY

The above and other needs are met by a system for debugging constraints in a design simulation, a computer-implemented method, and a non-transitory computer-readable storage medium storing executable code.

One embodiment of a system for debugging constraints in a design simulation, comprises a processor configured to execute modules, and a memory storing the modules. The modules include a design verification environment configured to: responsive to reaching a breakpoint in the design simulation, pause the design simulation and execute a constraint solver, the design simulation including constraint information that includes a plurality of constraints. The design verification environment is also configured to present constraint static information that describes an organization of a portion of the plurality of constraints, and present constraint dynamic information that describes an activity level of the portion of the plurality of constraints. The design verification environment is configured to receive a modification of the constraint information, and execute a call to solve the portion of the plurality of constraints using the modified constraint information and the constraint solver to create one or more results. The design verification environment is configured to resume the design simulation using the modified constraint information without re-starting the design simulation.

One embodiment of a non-transitory computer-readable storage medium storing executable computer program instructions for debugging constraints in a design simulation, comprises responsive to reaching a breakpoint in a design simulation, pausing the design simulation and executing a constraint solver, the design simulation including constraint information that includes a plurality of constraints. Constraint static information is presented that describes an organization of a portion of the plurality of constraints, and constraint dynamic information is presented that describes an activity level of the portion of the plurality of constraints. A modification of the constraint information is received and a call is executed to solve the portion of the plurality of constraints using the modified constraint information and the constraint solver to create one or more results. The design simulation is resumed using the modified constraint information without re-starting the design simulation.

One embodiment of the computer-implemented method for debugging constraints in a design simulation, comprises responsive to reaching a breakpoint in a design simulation, pausing the design simulation and executing a constraint solver, the design simulation including constraint information that includes a plurality of constraints. Constraint static information is presented that describes an organization of a portion of the plurality of constraints, and constraint dynamic information is presented that describes an activity level of the portion of the plurality of constraints. A modification of the constraint information is received and a call is executed to solve the portion of the plurality of constraints using the modified constraint information and the constraint solver to create one or more results. The design simulation is resumed using the modified constraint information without re-starting the design simulation.

DETAILED DESCRIPTION

The Figures (FIGS.) and the following description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures. It is noted that wherever practicable similar or like reference numbers may be used in the figures and may indicate similar or like functionality.

A design verification workstation contains both debug and constraint solver capabilities during simulation of a design under test (DUT). A TestBench generates random stimulus as inputs to drive the simulation. The random stimuli encapsulate the environment surrounding DUT, and are described via a plurality of constraints. A constraint is an expression used to restrict the random stimulus. A constraint may include one or non-random variables, one or more random variables, one or more conditional statements, one or more constants, or some combination thereof. For example, a constraint may be a+b==10 where a and b are two random integers.

The design verification workstation is configured to allow a user to debug constraints, stop the constraint solver, navigate problems and variables, and make modifications on-the-fly during the simulation to constraint information. Constraint information is information associated with constraints in the design simulation. Constraint information may include, e.g., one or more constraints, static constraint information (e.g., the organization of the constraints), dynamic constraint information (e.g., an activity level of the constraints—shows which constraints are enabled and/or disabled), portions of solution space for a constraint and/or random variable, portions of relation space for a constraint and/or random variable, diagnostic information, some other information that imparts information about a constraint, or some combination thereof. Additionally, in some embodiments, the design verification workstation may allow a user to use a constraint solver to experiment if the modifications will lead to desired test stimulus. Since this debug process happens during simulation, users do not need to recompile the test case. Additionally, once a user is satisfied with the modifications made to the simulation, the modification may be saved for future usage.

Configuration Overview

Figure 1:
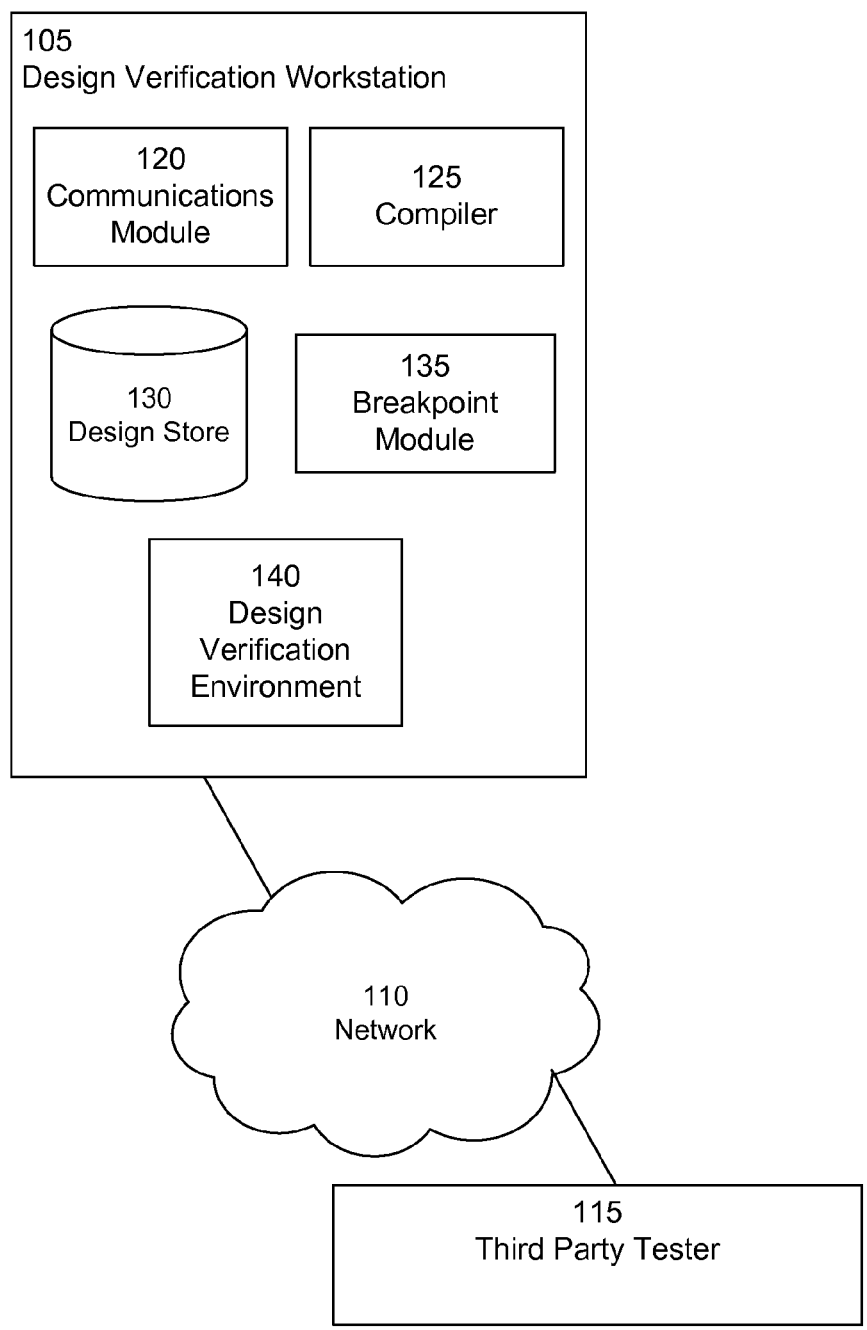
FIG. 1 is a high-level block diagram illustrating an embodiment of a design verification system for designing a system on a chip according to an example embodiment.

FIG. 1 is a high-level block diagram illustrating an embodiment of a design verification system 100 for designing a system on a chip (SoC) according to an embodiment. The system 100 includes a design verification workstation 105 connected by a network 110 to a third party tester 115. Here, only one design verification workstation 105 and third party tester 115 are illustrated but there may be multiple instances of each of these entities. For example, a design verification workstation 105 may be in communication with multiple and third party testers 115.

The network 110 provides a communication infrastructure between the design verification workstation 105 and the third party tester 115. The network 110 is typically the Internet, but may be any network or grouping of network separate from or in addition to the Internet including, but not limited to, a Local Area Network (LAN), a Metropolitan Area Network (MAN), a Wide Area Network (WAN), a mobile wired or wireless network, a private network, or a virtual private network. Here, the network 110 provides communications between the design verification workstation 105 and the third party tester 115, but it can also provide communications between other components in other architectures of the circuit design verification system. For example, the components 120-140 may be implemented on separate devices rather than on a single workstation and network 110 can provide communications between these components.

The third party tester 115 includes one or more different test software applications. A user may use the one or more test software applications to perform data processing on the received test data. For example, the one or more software applications may be used to perform advanced data processing, graphing/charting, and related analysis and visualizations (e.g., via spreadsheet, data analysis, etc.) on the testing information. Additionally, in some embodiments, the design verification workstation 105 may include one or more test software applications. The third party tester 115 is configured to receive testing information from the design verification workstation 105. The testing information can be any data that is shared between the design verification workstation 105 and the third party tester 115. Testing information may include for example, multiple-time rerandomization results. Additionally, in some embodiments, the analyzed testing information may be exported back to the design verification workstation 105.

The design verification workstation 105 is a computing device that executes computer program modules (i.e., the TestBench) which allow a user to create, simulate, and debug SoC designs. A TestBench is a virtual environment used to verify the correctness of a SoC design. A design verification workstation 105 might be, for example, a personal computer, a tablet computer, a laptop computer, etc. Some embodiments of the optical design workstation have different modules than those described here. Similarly, the functions can be distributed among the modules in a different manner than is described here. The design verification workstation 105 comprises a communications module 120, a compiler 125, a design store 130, a breakpoint module 135 and a design verification environment 140 in one embodiment. Additionally, in some embodiments, the design verification workstation 105 may contain one or more test software applications to perform data processing on received test data.

The communications module 120 communicates data between the design verification workstation 105 and the third party tester 115, via the network 110. The communications module 120 sends testing information, via the network 110, to the third party tester 115. Additionally, in some embodiments, the communications module 120 is configured to receive analyzed testing information, via the network 110, from the third party tester 115.

The compiler module 125 compiles source code for a design model of a SoC into compiled code which is executable by the design verification workstation 105. The source code is created for a design under test (DUT) of a particular SoC configuration. In some embodiments, the compiler 125 receives source code from the design store 130. Additionally, in some embodiments, the compiler 125 includes an interface allowing the user to create and/or modify source code on the fly, and then compile some or all of the source code. The compiled code for the design model, when executed is referred to as a design simulation.

The design store 130 stores designs for verification by the design verification workstation 105. The designs may be stored as source code, compiled code, runtime information, etc.

The breakpoint module 135 enables a user to set one or more breakpoints in the design verification simulation. The breakpoint module 135 allows the user to set the breakpoints prior to and/or during the design verification simulation. In a typical simulation, there are multiple randomizations but the user is not interested in debugging every one of them. In some embodiments, the breakpoints may be set at a particular randomize call. A randomize call is a call made to the design verification environment 140 (e.g., to the simulator) to generate constrained random values for the stimulus or part of the stimulus satisfying the constraints associated with it.

In some embodiments, the breakpoint module 135 allows a user to designate that a breakpoint when reached may: cause the simulation to pause; cause the simulation to skip a breakpoint; or cause the simulation to pause or skip a breakpoint, if a certain number of pauses have occurred. A pause in the simulation may range in duration, for example, predefined periods that may be short to long periods of time (e.g., a few seconds to 60 seconds) or result in a stop in the simulation.

In some embodiments, the breakpoint module 135 is able to automatically determine the locations of randomize calls in the design verification simulation. Accordingly, the breakpoint module 135 is able to automatically place breakpoints at the locations of randomize calls without receiving specific locations in the design verification simulation for the randomize calls.

In some embodiments, the breakpoint module 135 enables a user to set one or more breakpoints at specific randomized calls using unique tags (e.g., serial numbers) that identify them. For example, a serial number can be used to identify a particular randomize call (e.g. the serial number 5 for the $5^{th}$ randomize call in the simulation). In some embodiments, the breakpoint module 135 automatically assigns a serial number to each randomized call. In some embodiments, the breakpoint module 135 allows a user to assign a serial number to a randomize call. For example, the breakpoint module 135 may enable a user to set a breakpoint using a serial number associated with the second randomized call that occurs in the design verification simulation.

In some embodiments, the breakpoint module 135 is able to set a breakpoint at any randomize call which meets specified solver conditions. A solver condition is a description of the relationships amongst any random or non-random variables involved in the randomization. For example, constraint may be a+b==10 where a and b are two random integers. There are many solutions satisfying this constraint but a solver condition might be when a>3. The ability to set breakpoints in this manner may be useful so the design simulation is not paused every time the solver generates a solution for a set of constraints, or to pause the design simulation when particular conditions are met. Examples of solver conditions may include a class name matching a specified name, an object ID matching a specified name, a solver condition expression matching with a specified value (e.g., when a specified variable is solved to some value), inconsistencies between variable values, timeouts that occur in attempting to solve a variable, etc. These name matching or text matching can involve regular expressions, etc.

The design verification environment 140 performs the design verification simulation of the design under test. If during the design verification simulation a breakpoint is reached such that the design simulation is paused, the design verification environment 140 may execute a debug user interface. The debug interface allows a user to analyze and modify data from a constraint solver. The constraint solver ("solver") is the engine that generates solutions satisfying the constraints that relate to multiple random variables defined in the TestBench code. The debug interface allows a user to perform operations in solution space and/or relation space without having to recompile and re-execute the design verification simulation.

Solution space describes all the solutions for a given variable within a constraint. Operations in solution space include, for example, randomizing serial numbers, problem partitions (e.g., smaller partitions used to solve a smaller number of random variables in each partition for a single randomization problem), enabling constraint blocks (e.g., a block of one or more constraints), disabling constraint blocks, modification (e.g., creation, modification, or deletion thereof) of constraints, modification (e.g., creation, modification, or deletion thereof) of variables, modification (e.g., creation, modification, or deletion thereof) of variable values, display of initial value ranges (e.g., organized tree), or some combination thereof. Additionally, from solution space, the debug interface allows a user to obtain source code location or class information for randomize/variable/constraint block/constraint expression, dropped/honored soft constraints, default constraint, constraint_mode on/off state, rand_mode on/off inside solution space or through cross-probing. In some embodiments, small test cases could be extracted from solver space for either whole randomization or specified partition, without re-running the design simulation. This would allow a user to investigate the issue separately. In some embodiments, utilities like filtering by text or type, and searching on constraint block or solved variable are supported inside solution space. In some embodiments, a profile can be dumped or shown on demand for whole randomization or for one or more specified partitions. A profile may be, for example, memory usage profiles or profiles of how long operations are taking to perform, etc. In some embodiments, diagnostics for which variable, constraint, operator, or some combination thereof, causing a lot of backtracking and/or performance slowness is also provided inside solution space.

In some embodiments, from solution space and/or inside relation space, a user is able to query the related variables for any variables involved in the randomization, and check the corresponding constraints to see how these variables are connected. Relation space describes all the relationships for a given variable with other constraints in the design simulation. For example, relations space for a particular variable X would include any constraint that utilizes X. An analysis in the relation space allows the user to quickly see how a random variable relates to one or more other random variables. One reason this is useful is due to the increased use of verification IP, users may not be fully aware of all the constraints that are already built-in from the verification IP. Thus, presenting the relation space of a constraint problem (e.g., the user's code plus what already exists from the verification IP) to a user may be important to identify the nature of the constraint problem the user is trying to debug. The debug interface allows a user to query the variables that are directly connected through constraints, or transitively connected through constraints. This can also be quantitatively selected with the degree of transitive connectivity. Given a large set of constraints, this capability allows the user to find related variables or constraints, i.e., ability to zoom-in to subset of constraints. Additionally, filtering by regular expression text or partition, etc. is supported.

In some embodiments, if current randomization has inconsistency or timeout, the debug interface may display portions of solution and/or relation space. The displayed portion of solution space can show, for example, the problems already solved and a minimum set of constraints which causes inconsistency/timeout and related variables. Additionally, the debug interface may display variables involved in inconsistency/timeout.

The design verification environment 140 also enables a user to dynamically modify (e.g., add, delete, or edit) constraints and related attributes during the design simulation via an interface. In some embodiments, the interface may be the debug interface. In other embodiments, it may be some other graphical-user interface (GUI). Being able to dynamically modify constraints and related attributes enables the user to try different ideas in the debug process, and see the immediate outcome of those ideas. For example, a user may, on-the-fly, perform re-randomization that yields an outcome that is problematic, the user may utilize the solution space/relation space analysis to better understand the new problem and then try other ideas. This interactive process can be iterative until the problem is solved and may be done without any need to modify the original source code, to recompile the design, and to rerun the simulation. This can offer significant time saving and reduce debug turnaround time as this interactive analysis can be done with reduced number of (sometimes multiple) design re-compilation and re-simulation.

The design verification environment 140 enables a user to dynamically modify constraint information (e.g., constraints) during the design simulation in a number of ways. In some embodiments, the design verification environment 140 enables a user to switch on/off one or more constraint modes associated with one or more constraint blocks during the design simulation via, e.g., command and/or GUI operation (e.g., via the debug interface). For example, in one embodiment, a unified command-line interface (UCLI) command: call obj.cons1.constraint_mode(0) can set the constraint mode for constraint block "cons1 " in object "obj" to off. Besides UCLI, other debug interfaces can also be used.

In some embodiments, the design verification environment 140 enables a user to switch on/off a random mode for one or more random variables during the design simulation by command (e.g., a UCLI command: call obj.rvar1.rand_mode(0)) and/or GUI operation.

In some embodiments, the design verification environment 140 enables a user to enable or disable one or more constraint during the design simulation by command and/or GUI operation. For example, in one embodiment, a UCLI command: constraints disable -object obj -block cons1 -id 1 disables the constraint with id "1" in constraint block "cons1" of object "obj." The id is decided during compilation, and each constraint has a unique id in a constraint block.

In some embodiments, the design verification environment 140 enables a user to add one or more new constraint blocks with constraint expressions to a specified object expressions during the design simulation by command and/or GUI operation. For example, in one embodiment, a UCLI command: constraints add -object obj -block newcons -expr "a>0; b<0;" adds a new constraint block "newcons" to object "obj", with two constraint expression: "a>0" and "b<0". Additionally, in some embodiments, the design verification environment 140 enables a user to change one or more variable values.

The design verification environment 140 allows the user to re-launch the randomization one or more times using the modified constraints and/or related attributes via the interface. The results of the re-launched randomization are presented to the user via the interface. The user may then review the results, modify the constraints and/or attributes and re-launch the randomization or accept the results and continue with the design simulation using the modified constraints and/or related attributes.

In embodiments where one-time re-randomization occurs, the user can check the newly generated results (i.e., values of random variables) with the on-the-fly modification. The design verification environment 140 is able to automatically compare the new values of random variables with old values from original randomization, and annotate the difference via the interface (e.g., the debug interface).

In embodiments where multiple-times re-randomization (MT Re-rand) occurs, the design verification environment 140 may provide some or all results generated from current multiple-times re-randomization, some or all results generated from current multiple-times re-randomization, some or all results generated from previous multiple-times re-randomization, or some combination thereof, to the user via the interface and/or a third party.

The design verification environment 140, responsive to user input, can perform data analysis on the generated results. In some embodiments, the design verification environment 130 may analyze the generated results using, e.g., a built-in histogram drawer for single variable, and/or one or more third-party tools. In some embodiments, the one or more third party tools may be launched directly from distribution space. The design verification environment 130 can plot a graph for one or more variables. In embodiments with two variables, a two variable graph can be plotted in 3D to show the correlation between these two variables in the solution space. Similar data analysis can be performed for multiple variables.

Additionally, in some embodiments, the design verification environment 140 may output some or all of the analysis on the collected values to one or more third software applications. The one or more third party software applications may reside on the third party tester 115, the design verification workstation 105, or both.

Figure 2:
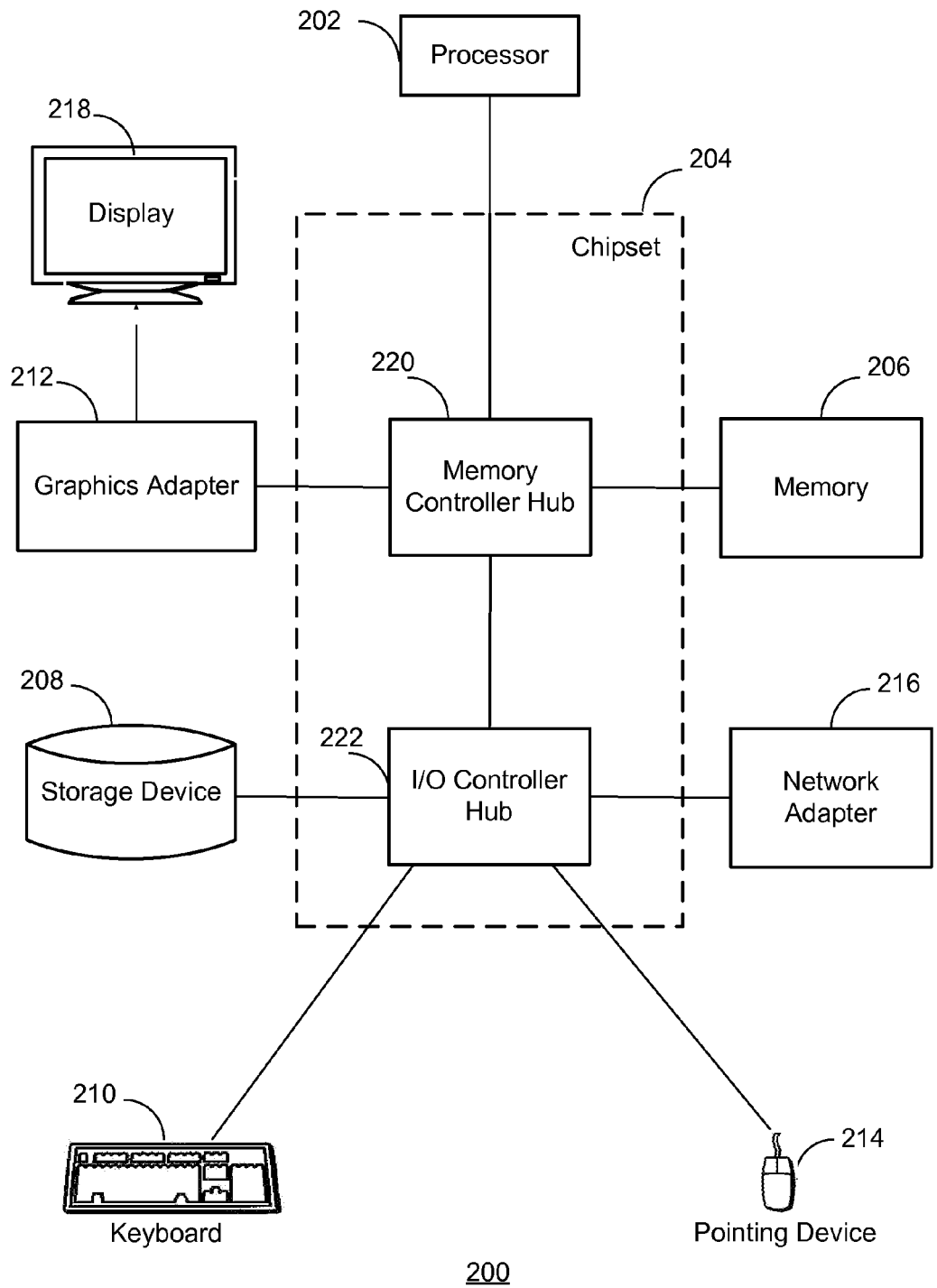
FIG. 2 is a high-level block diagram illustrating an example computer for implementing the entities shown in FIG. 1.

FIG. 2 is a high-level block diagram illustrating an example computer 200 for implementing the entities shown in FIG. 1. The computer 200 includes at least one processor 202 coupled to a chipset 204. The chipset 204 includes a memory controller hub 220 and an input/output (I/O) controller hub 222. A memory 206 and a graphics adapter 212 are coupled to the memory controller hub 220, and a display 218 is coupled to the graphics adapter 212. A storage device 208, keyboard 210, pointing device 214, and network adapter 216 are coupled to the I/O controller hub 222. Other embodiments of the computer 200 have different architectures.

The storage device 208 is a non-transitory computer-readable storage medium such as a hard drive, compact disk read-only memory (CD-ROM), DVD, or a solid-state memory device. The memory 206 holds instructions and data used by the processor 202. The pointing device 214 is a mouse, track ball, or other type of pointing device, and is used in combination with the keyboard 210 to input data into the computer 200. The graphics adapter 212 displays images and other information on the display 218. The network adapter 216 couples the computer 200 to one or more computer networks.

The computer 200 is adapted to execute computer program modules for providing functionality described herein. As used herein, the term "module" refers to computer program logic used to provide the specified functionality. Thus, a module can be implemented in hardware, firmware, and/or software. In one embodiment, program modules are stored on the storage device 208, loaded into the memory 206, and executed by the processor 202.

The types of computers 200 used by the entities of FIG. 1 can vary depending upon the embodiment and the processing power required by the entity. For example, the design verification workstation 105 might comprise multiple blade servers working together to provide the functionality described herein. The computers 200 can lack some of the components described above, such as keyboards 210, graphics adapters 212, and displays 218.

Figure 3:
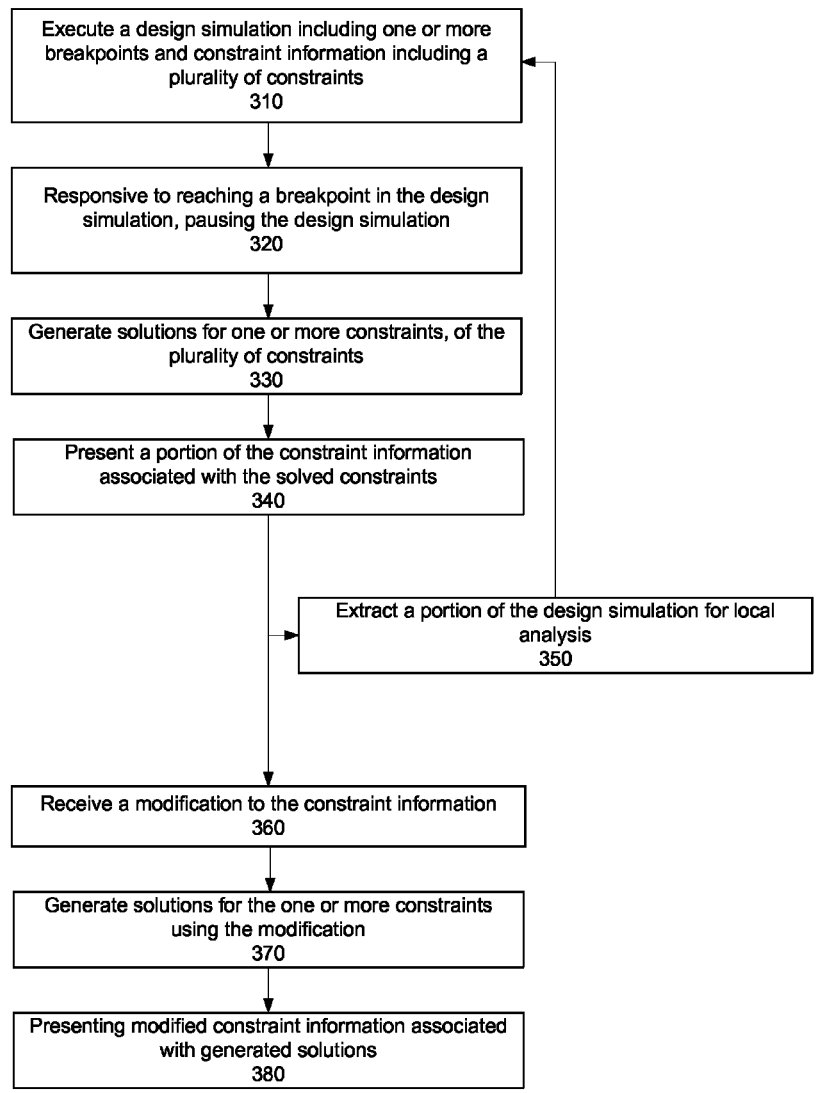
FIG. 3 is a flowchart illustrating a design verification process for a portion of a design simulation according to an example embodiment.

FIG. 3 is a flowchart illustrating a design verification process for a portion of a design simulation according to an embodiment. In one embodiment, the process of FIG. 3 is performed by the design verification workstation 105. Other entities may perform some or all of the steps of the process in other embodiments. Likewise, embodiments may include different and/or additional steps, or perform the steps in different orders.

The design verification workstation 105 executes 310 a design simulation including one or more breakpoints. The design simulation may be, e.g., a System Verilog simulation. The design simulation includes constraint information including a plurality of constraints. For example, the design verification workstation 105 can use a TestBench and a DUT to compile an executable version of a design model (i.e., the design simulation). The design simulation is executed, and one or more breakpoints are added. In some embodiments, the one or more breakpoints are added prior to the execution of the design simulation.

Responsive to reaching a breakpoint (e.g., location of a randomized call) in the design simulation, the design verification workstation 105 pauses 320 the design simulation. The design verification workstation 105 generates 330 solutions (e.g., using a constraints solver) that satisfy one or more constraints associated with one or more randomized calls at the breakpoint. Additionally, in some embodiments, the design verification workstation 105 generates solutions for constraints at other locations in the design simulation (e.g., at prior breakpoints).

The design verification workstation 105 presents 340 (e.g., via a debug interface) constraint information associated with the solved constraints. The presentation of constraint information may include, e.g., one or more constraints, static constraint information, dynamic constraint information, portions of solution space for a constraint and/or random variable, portions of relation space for a constraint and/or random variable, diagnostic information, some other information that imparts information about a constraint, or some combination thereof. The information displayed facilitates understanding of the constraint problem and enables a user to quickly identify and debug constraint problems. For example, the information presented allows a user using the design verification workstation 105 to cross reference with the original source code, review the static and/or dynamic constraint information, perform solution space analysis, perform relation space analysis, etc.

In some instances, the process flow moves from step 340 to step 360, such that the design verification workstation 105 receives 360 a modification to the constraint information. For example, a user based in part on the information presented by the design verification workstation 105 may decide to enable/disable a constraint expression, modify (add, edit, delete) a constraint expression, turn on/off a particular block of constraints, adding a variable, deleting a variable, enabling/disabling a randomization of a variable, modifying a variable value, etc., to debug an particular issue with the design simulation. For example, the information presented in step 340 may include diagnostic information that shows which constraints take the longest to solve. A user may then modify the constraint information to minimize the time taken to solve the constraint. The design verification workstation 105 generates 370 (e.g., using the constraint solver) solutions for the one or more constraints using the modification. The modified constraint information may be generated using the design simulation and/or a portion of the design simulation. The design verification workstation 105 presents 380 modified constraint information associated with the generated solutions. Thus, allowing a user to easily see how a modification to some portion of the constraint information affects the constraint information associated with the extracted portion or possibly the entire design simulation.

In other instances, the design verification workstation 105 may extract 350 a portion of the design simulation for local analysis. For example, a user may provide a command to the design verification workstation 105 causing the design verification workstation 105 to extract a portion of the design simulation. Extracting a portion of the design simulation refers to extracting a subset of the constraint problem that is being debugged. For example, assuming there are 4 random variables (x, y, u, and v), and there are two constraints (x>y and u==v), thus it is a 4 variable constraint problem where x is related to y through a comparison operator (>) and u is related to v via an equality operator (==). The design verification workstation 105 breaks up the 4 variable constraint problem into two sub-problems, specifically, (1) a sub-problem including two random variables x, and y, with a constraint of x>y, and (2) a sub-problem including two random variables u and v, with the constraint u==v. The design verification workstation 105 may then perform local analysis on one or both of the extracted sub-problems. Local analysis may be, e.g., solution space and/or relation space analysis performed with respect to the extracted portion of the design simulation. In some embodiments, the portion of the design simulation extracted is associated with the constraints associated with the one or more randomized calls at the breakpoint. Alternatively, the extracted portion may include some other portion of the design simulation and/or be some other portion of the design simulation. This can be useful to the user, as it limits the scope of a particular problem the user is trying to solve, thereby limiting the constraints, random variables, etc., being presented to the user for modification to those relevant to the extracted portion of the design simulation.

Once local analysis is performed, the design verification workstation 150 may perform steps substantially similar to steps 310-380, but based on the extracted portion of the design simulation. Once the user is satisfied with the modified constraint information, the design verification workstation 105, the process flow moves back to 310 in a manner that may include modifications to the constraint information made using the extracted portion of the design simulation—which are then applied to the entire design simulation.

Figure 4:
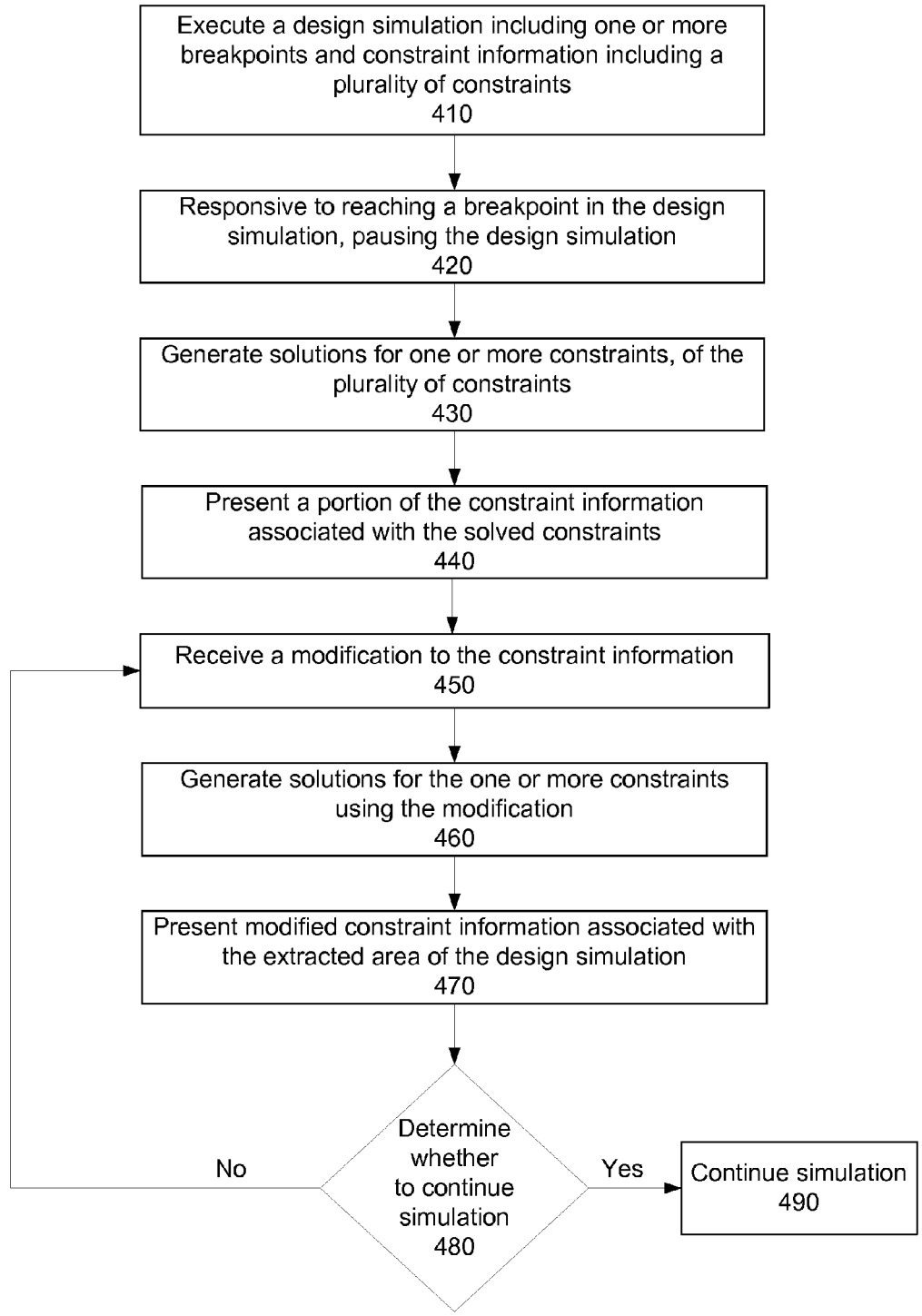
FIG. 4 is a flowchart illustrating a design verification process for a design simulation according to an example embodiment.

FIG. 4 is a flowchart illustrating a design verification process for a design simulation according to an example embodiment. In one embodiment, the process of FIG. 4 is performed by the design verification workstation 105. Other entities may perform some or all of the steps of the process in other embodiments. Likewise, embodiments may include different and/or additional steps, or perform the steps in different orders.

Steps 410-440 are substantially the same as steps 310-340 described above with respect to FIG. 3. However, instead of then extracting a portion of the design simulation, the design verification 105 receives 450 a modification to the constraint information. For example, a user may, e.g., modify (add, edit, or delete) a constraint, enabling/disabling a constraint block, turn on/off a constraint, or some combination thereof. In some embodiments, the user may modify the constraint information using a modification determined via the process described above with regard to FIG. 3.

The design verification workstation 460 generates solutions to the one or more constraints (e.g., using the constraint solver) using the modification. In some embodiments, the design verification workstation 105 performs solves the constraints only once (one-time re-randomization). In other embodiments, the design verification workstation may solve the constraints using the modification a number of times (multi-time re-randomization—e.g., 100, 1000, or any other number) thus creating a distribution of values associated with the one or more constraints. Note, the design verification workstation 105 generates the solutions without re-compile and/or restart of the design simulation, thus reducing debug time associated with a design simulation.

The design verification workstation 105 presents (e.g., via a debug interface) modified constraint problem. For example, the design verification workstation 105 may present updated static constraint information, dynamic constraint information, a solution distribution, some other portion of the modified constraint information, or some combination thereof.

Accordingly, using the design verification workstation 105 a user may check if and the modification of constraints is robust, for example, by performing a one-time re-randomization to see if there is an inconsistency during the simulation. If there is an inconsistency, the user can check the conflicting constraints and determine a solution to the inconsistency. Additionally, the design verification workstation 105 may perform multiple re-randomizations to analyze the solution distribution of random variables to check if a performance condition (e.g. coverage goal) can be met. Additionally, the design verification workstation 105 allows the simulation to continue even though the user may have modified one or more constraints and/or related attributes.

The design verification workstation 105 may then determine 480 whether to continue the simulation. If no command to return to the design simulation is received, the process flow moves to step 450 and the user may continue to modify the constraint information. In some embodiments, the design verification workstation 105 automatically continues 490 the design simulation once performance conditions are met. In some embodiments, a user may command the design verification workstation 105 to continue 490 the design simulation. In some embodiments, the design verification workstation 105 continues 490 the design simulation using the modified constraint information.

In some embodiments, once user is satisfied with the randomization results, the user may instruct the design verification workstation 105 to save any current modification back to the original TestBench and/or a new TestBench. The user may then instruct the design verification workstation 105 to re-compile and run simulation to apply the final solution to generate the desired results.

Additional Configuration Considerations

The disclosed configuration beneficially allows the user to enable make modifications "on-the-fly" (e.g., real time) to the constraints during the simulation without having to recompile and restart the simulation. Users can modify (e.g., add, delete, or edit) constraints, change variable values and related attributes, and use the constraint solver to determine the changes that lead to a desired test stimulus. Additionally, because this debug process happens during simulation, the users do not need to recompile the test case. Once a user is satisfied with the results, the modification may be saved for future usage. Accordingly, the disclosed configuration accelerates TestBench verification by advanced constraint debug with "what-if" analysis without recompilation to enable rapid stimulus convergence. In addition, the disclosed configuration can be used during active TestBench development so that as the users develop constraints to create stimulus for the verification purposes, the users can use the solution/relation space analysis and distribution debug capabilities to see and dynamically (e.g., on-the-fly) modify constraints and re-randomizations. This continuously refines the randomization results and thereby enhances the quality of the stimulus that these constraints are intended to describe.

Some portions of the above description describe the embodiments in terms of algorithmic processes or operations. These algorithmic descriptions and representations are commonly used by those skilled in the data processing arts to convey the substance of their work effectively to others skilled in the art. These operations, while described functionally, computationally, or logically, are understood to be implemented by computer programs comprising instructions for execution by a processor or equivalent electrical circuits, microcode, or the like. Furthermore, it has also proven convenient at times, to refer to these arrangements of functional operations as modules, without loss of generality. The described operations and their associated modules may be embodied in software, firmware, hardware, or any combinations thereof. In one embodiment, a software module is implemented with a computer program product comprising a non-transitory computer-readable medium containing computer program code, which can be executed by a computer processor for performing any or all of the steps, operations, or processes described.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a system and a process to debug constraints in a design simulation. Thus, while particular embodiments and applications have been illustrated and described, it is to be understood that the described subject matter is not limited to the precise construction and components disclosed herein and that various modifications, changes and variations which will be apparent to those skilled in the art may be made in the arrangement, operation and details of the method and apparatus disclosed herein.

What is claimed is:

1. A system to debug constraints in a design simulation, comprising:
a processor configured to execute modules; and
a memory storing the modules, the modules comprising:
a design verification environment configured to:
pause the design simulation and execute a constraint solver in response to reaching a breakpoint in the design simulation, the design simulation including constraint information that includes a plurality of constraints,
extract a portion of the design simulation associated with a portion of the plurality of constraints,
present constraint static information that describes an organization of the portion of the plurality of constraints,
present constraint dynamic information that describes an activity level of the portion of the plurality of constraints,
receive a modification of the constraint information within the extracted portion of the design simulation,
execute a call to solve the portion of the plurality of constraints using the modified constraint information and the constraint solver to generate one or more results, the one or more results including solutions for the portion of the plurality of constraints,
present the solutions, and
resume the design simulation using the modified constraint information without re-starting the design simulation.

2. The system of claim 1, wherein the design verification environment is further configured to:
solve the constraints using the modified constraint information a plurality of times to create distribution statistics of random variables associated with the constraints without re-compiling the design simulation; and
provide for display the distribution statistics.

3. The system of claim 1, further comprising:
a breakpoint module configured to:
determine locations in the design simulation for a plurality of randomize calls to solve a portion of the plurality of constraints; and
place breakpoints at the determined locations.

4. The system of claim 3, wherein the breakpoint module is further configured to:
determine that the plurality of randomize calls meet one or more specified solver conditions.

5. The system of claim 4, wherein the solver conditions are selected from a group comprising:
a class name matching a specified name, an object ID matching a specified name, a solver condition expression matching a specified value, an inconsistency between variable values and constraints, and a timeout that occurs in attempting to solve a variable.

6. The system of claim 1, wherein the modification of the constraint information is selected from a group comprising:
enabling a constraint expression, disabling a constraint expression, adding a constraint expression, deleting a constraint expression, editing a constraint expression, turning on a constraint block, turning off a constraint block, adding a variable, deleting a variable, enabling the randomization of a variable, disabling the randomization of a variable, and modification of a variable value.

7. A design verification workstation implemented method to debug constraints in a design simulation, the design verification workstation including a processor, the method comprising:
responsive to reaching a breakpoint in the design simulation, pausing, by the design verification workstation, the design simulation and executing a constraint solver, the design simulation including constraint information that includes a plurality of constraints;
extracting, by the design verification workstation, a portion of the design simulation associated with a portion of the plurality of constraints;
presenting, by the design verification workstation, constraint static information that describes an organization of the portion of the plurality of constraints;
presenting, by the design verification workstation, constraint dynamic information that describes an activity level of the portion of the plurality of constraints;
receiving, by the design verification workstation, a modification of the constraint information within the extracted portion of the design simulation;
executing, by the design verification workstation, a call to solve the portion of the plurality of constraints using the modified constraint information and the constraint solver to generate one or more results, the one or more results including solutions for the portion of the plurality of constraints;
presenting, by the design verification workstation, the solutions; and
resuming, by the design verification workstation, the design simulation using the modified constraint information without re-starting the design simulation.

8. The method of claim 7, further comprising:
solving the constraints using the modified constraint information a plurality of times to create distribution statistics of random variables associated with the constraints without re-compiling the design simulation; and
displaying the distribution statistics.

9. The method of claim 7, further comprising:
  determining locations in the design simulation for a plurality of randomize calls to solve a portion of the plurality of constraints; and
  placing breakpoints at the determined locations.

10. The method of claim 9, wherein placing breakpoints at the determined locations further comprises:
  determining that that the plurality of randomize calls meet one or more specified solver conditions.

11. The method of claim 10, wherein the solver conditions are selected from a group comprising:
  a class name matching a specified name, an object ID matching a specified name, a solver condition expression matching a specified value, an inconsistency between variable values, and a timeout that occurs in attempting to solve a variable.

12. The method of claim 7, wherein the modification of the constraint information is selected from a group comprising:
  enabling a constraint expression, disabling a constraint expression, adding a constraint expression, deleting a constraint expression, editing a constraint expression, turning on a constraint block, turning off a constraint block, adding a variable, deleting a variable, enabling the randomization of a variable, disabling the randomization of a variable, and modification of a variable value.

13. A non-transitory computer-readable storage medium storing executable computer program instructions executable by a processor for debugging constraints in a design simulation, the instructions when executed by the processor performs steps comprising:
  responsive to reaching a breakpoint in the design simulation, pausing the design simulation and executing a constraint solver, the design simulation including constraint information that includes a plurality of constraints;
  extracting a portion of the design simulation associated with a portion of the plurality of constraints;
  presenting constraint static information that describes an organization of the portion of the plurality of constraints;
  presenting constraint dynamic information that describes an activity level of the portion of the plurality of constraints;
  receiving a modification of the constraint information within the extracted portion of the design simulation;
  executing a call to solve the portion of the plurality of constraints using the modified constraint information and the constraint solver to generate one or more results, the one or more results including solutions for the portion of the plurality of constraints;
  presenting the solutions; and
  resuming the design simulation using the modified constraint information without re-starting the design simulation.

14. The computer-readable medium of claim 13, further comprising:
  solving the constraints using the modified constraint information a plurality of times to create distribution statistics of random variable associated with the constraints without re-compiling the design simulation; and
  displaying the distribution statistics.

15. The computer-readable medium of claim 13, further comprising:
  determining locations in the design simulation for a plurality of randomize calls to solve a portion of the plurality of constraints; and
  placing breakpoints at the determined locations.

16. The computer-readable medium of claim 15, wherein placing breakpoints at the determined locations further comprises:
  determining that that the plurality of randomize calls meet one or more specified solver conditions.

17. The computer-readable medium of claim 16, wherein the solver conditions are selected from a group comprising:
  a class name matching a specified name, an object ID matching a specified name, a solver condition expression matching a specified value, an inconsistency between variable values, and a timeout that occurs in attempting to solve a variable.

18. A design verification workstation implemented method to debug constraints in a design simulation, the design verification workstation including a processor, the method comprising:
  responsive to reaching a breakpoint in the design simulation, pausing, by the design verification workstation, the design simulation and executing a constraint solver, the design simulation including constraint information that includes a plurality of constraints;
  extracting, by the design verification workstation, a portion of the design simulation associated with a portion of the plurality of constraints;
  executing, by the design verification workstation, a call to solve the portion of the plurality of constraints using (1) modified constraint information within the extracted portion of the design simulation, and (2) the constraint solver, to generate one or more results that include solutions for the portion of the plurality of constraints; and
  resuming, by the design verification workstation, the design simulation using the modified constraint information without re-starting the design simulation.

19. The method of claim 18, further comprising:
  presenting constraint static information that describes an organization of the portion of the plurality of constraints; and
  presenting constraint dynamic information that describes an activity level of the portion of the plurality of constraints.

* * * * *